United States Patent [19]

Bluzer et al.

[11] 4,364,164
[45] Dec. 21, 1982

[54] METHOD OF MAKING A SLOPED INSULATOR CHARGE-COUPLED DEVICE

[75] Inventors: Nathan Bluzer, Silver Spring; Arthur S. Jensen, Baltimore, both of Md.; Dieter K. Schroder, Wilkins Township, Allegheny County; Paul R. Malmberg, Edgewood, both of Pa.

[73] Assignee: Westinghouse Electric Corp., Pittsburgh, Pa.

[21] Appl. No.: 260,439

[22] Filed: May 4, 1981

Related U.S. Application Data

[60] Division of Ser. No. 966,533, Dec. 4, 1978, which is a continuation of Ser. No. 806,402, Jun. 14, 1977, abandoned.

[51] Int. Cl.³ ............................................. H01L 21/20
[52] U.S. Cl. .................... 29/571; 29/576 B; 29/578; 29/579; 29/590; 148/171; 148/187; 156/653; 156/657
[58] Field of Search ............... 29/571, 576 B, 578, 29/579, 590; 156/657, 653; 148/171, 175, 187, 1.5; 357/24

[56] References Cited

U.S. PATENT DOCUMENTS 4,098,638 4/1978 Kub et al. ..................... 29/579 X
4,123,834 11/1978 Bluzer ............................... 29/578
4,216,574 8/1980 Feist ................................. 29/578

FOREIGN PATENT DOCUMENTS 52-72187 6/1977 Japan ................................ 357/24

Primary Examiner—G. Ozaki
Attorney, Agent, or Firm—W. E. Zitelli

[57] ABSTRACT

A charge-coupled device includes an insulation layer which is interfaced with a semiconductor wafer. Gating electrodes that are responsive to clocking signals are located on the surface of the insulation layer which is oppositely disposed from the interface with the semiconductor wafer such that the electric field produced by the potential on the electrodes has a substantial lateral component in the plane of the semiconductor-insulator interface. The lateral field component induced in the semiconductor wafer reduces the transfer time of charge carriers between adjacent electrodes thereby improving the transport response of the charge carriers to the clocking signals. A method for making the sloped oxide charge-coupled device is also described in which the insulation layer grown on a semiconductor is provided with sloped areas and the electrodes are evaporated onto these sloped areas to form the device's clocking structure.

9 Claims, 20 Drawing Figures

METHOD OF MAKING A SLOPED INSULATOR CHARGE-COUPLED DEVICE

CROSS REFERENCES TO RELATED APPLICATIONS

This is a division of application Ser. No. 966,533, filed Dec. 4, 1978 which is a continuation of application Ser. No. 806,402, filed June 14, 1977, now abandoned.

The present application is related to the subject matter of "METHODS FOR MAKING A SLOPED INSULATOR FOR A SOLID STATE DEVICE" Ser. No. 806,400, filed June 14, 1977 by Francis Kub and Nathan Bluzer, and issued on July 4, 1978 as U.S. Pat. No. 4,098,638; and "AN OVERLAPPING ELECTRODE STRUCTURE FOR A SOLID STATE DEVICE" Ser. No. 806,401, filed June 14, 1977 by Nathan Bluzer, and issued on Nov. 7, 1978 as U.S. Pat. No. 4,123,834.

BACKGROUND OF THE INVENTION

1. Field of the Invention

The present invention is related to charge-coupled devices and, more particularly, to charge-coupled devices having low transfer times.

2. Description of the Prior Art

In the prior art, charge-coupled devices (CCD's) has been developed to provide for the controlled transfer of charge carriers in response to clocking signals. Briefly, prior art CCD's are comprised of a charge injection structure, a charge clocking structure, and a charge output structure. The charge clocking structure includes an insulation layer interfaced with a semiconductor wafer. Gating electrodes, attached to the surface of the insulation layer that is oppositely disposed from the semiconductor-insulation interface, are responsive to clocking signals to provide an electric field which establishes a space charge region in the semiconductor wafer. The timing and magnitude of the clocking signals are such that the profile of the space charge region forms potential wells of controlled depth and width, the wells being caused to move laterally along the semiconductor-insulator interface in accordance with the timing of the clocking signals. Signal charge carriers that are present in the semiconductor wafer are located in regions having the lowest potential energy so that the signal charge carriers are laterally transported along the semiconductor-insulator interface in accordance with the progression of the local potential well minima generated by the clocking signals on the electrodes.

Change carriers are introduced in the semiconductor by the charge injection structure which can have any of a variety of well-known mechanisms. Usually, the manner in which the charge carriers are introduced is dependent on the application of the CCD. For example, when the CCD is to be used as a delay line, the charge carriers are typically introduced electrically through a diode or an ohmic contact to the semiconductor. But, when the CCD is to be used as a light sensitive element, the charge carriers are introduced by photogenerating charge carriers directly within the CCD potential wells with photons. Similarly to the charge injection structure, the charge output or readout structure is dependent on the intended use of the CCD. Any of several well-known mechanisms may be employed in a particular application.

As explained previously with regard to the charge clocking structure, the signal charge carriers in the semi-conductor wafer are contained in the potential wells having the lowest local potential energy and are transported laterally along the semiconductor insulator interface as the position of the local potential well minima are laterally shifted in accordance with changes in the voltage applied to the gating electrodes. In the prior art CCD's, there are three transport mechanisms which cause the signal charge carriers to follow the potential wells through a lateral change in position. These mechanisms include: a self-induced drift field; a fringe drift field; and thermal diffusion. More specifically, the self-induced drift field results from the common polarity of the charge carriers and their proximity within the potential wells. That is, the common polarity charge carriers repelled one another and therefore tended to move the charge carriers in a lateral direction. The fringe drift field transport mechanism is the result of an overlap of the electric field provided by one electrode and the higher electric field provided by an adjacent electrode such that the charge carrier tends to be drawn toward the electrode having the stronger electric field. The thermal diffusion transport mechanism is produced by the thermal motion of the signal charge carriers. This carrier transport mechanism became most prominent at the end of each transfer cycle. Although it is comparatively slow, it is the chief transfer agent when self-induced drift has ceased and fringing fields do not reach sufficiently far under adjacent gates.

In the prior art, CCD's were often required in mechanisms which demanded high operating speed for the CCD. Therefore, there were in the prior art, further improvements made in the basic CCD to lower the required transfer time of charge carriers between adjacent electrodes and thereby increase the operational frequency of the CCD. In one improvement, the CCD was provided with a higher number of clocking signals which were applied to adjacent electrodes. The relative magnitudes of the clocking signals were such that they established a stepped space charge region in the semiconductor wafer which produced a potential profile with several levels of potential energy within the potential well region containing the charge carriers. Although this modification afforded some improvement in the transfer time of the CCD, the transport mechanisms remained, basically, the same. Also, in these prior art CCD's, the CCD conduction path was adjacent to the semiconductor-insulator interface so that surface states located at the interface imposed certain limitations on the CCD performance. Specifically, the surface states impaired the efficiency of the CCD's by trapping and/or scattering charge as it was transferred between adjacent CCD wells. Furthermore, the surface states acted as scattering centers which reduced the mobility of charge in the CCD and, therefore, the charge transfer speed of the CCD. Consequently, the need for a greater improvement in the transfer times remained.

To eliminate the undesirable interaction between the charge and the surface states at the semiconductor-insulator interface, the charge conduction path was located away from the interface. This class of CCD's is generally referred to as buried channel CCD's (BCCD). Locating the charge transport path inside the semiconductor increased the mobility of the charge carrier and reduced the number of trapping and scattering sites with which the charge signals would interact. Also, the location of the charge transport path away from the semiconductor-insulator interface in the BCCD's, magnified the influence of the fringing drift field on the charge transport between adjacent potential wells of the buried channel. Because the transport channel was located farther from the clocking electrodes in the BCCD's, the screening effect of adjacent clocking electrodes decreased, thereby increasing the fringing drift field effect. However, with larger amounts of charge in the buried channel, interaction between the surface and the charge in the buried channel occurred. Because the charge transport channel was physically disposed further from the clocking electrodes, the charge handling capability of the BCCD was reduced or, alternatively, a higher voltage was required for the clocking signals.

In order to move the buried charge transport channel further from the clocking electrodes to further magnify the fringing drift field effect and to minimize the interaction of the charge in the buried channel with the surface, a modification of BCCD's was developed known as the peristaltic CCD (PCCD). Similar to the BCCD's, the PCCD's provided a charge transport channel by reverse biasing a diode junction. To increase the charge handling capability of the PCCD, one of the semiconductor materials of the diode junction was given a graded impurity concentration. The gradient in impurity concentration in the PCCD's was such that most of the charge was located near the semiconductor-insulator interface while a smaller amount of charge was located at the diode junction. This charge distribution profile afforded increased charge handling capability by confining the charge near the clocking electrodes. The non-uniform impurity concentration of the semiconductor wafer also had the effect of concentrating the charge carriers to one side of the potential wells and in aiding them in their lateral transport as the position of the potential changed, thereby further improving the transfer times between adjacent potential wells of the PCCD. Although the modification of the BCCD's which resulted in the PCCD's had the effect of improving transfer times due to the non-uniform impurity concentration of the semiconductor under each electrode, the control of the impurity concentration over such small tolerances made these prior art devices relatively difficult to manufacture.

The limitation in the operational frequency of the prior art CCD's was inherent in the transfer mechanisms upon which their operation was based. This limitation was most severe in surface and buried channel CCD. Therefore, there remained a need for a CCD which would operate at frequencies several orders of magnitude higher than the frequencies obtainable by prior art surface and buried channel CCD's while retaining the structural simplicity of the surface channel devices.

SUMMARY OF THE INVENTION

In accordance with the present invention, a charge-coupled device is comprised of a semiconductor wafer forming an interface with an insulating layer. The surface of the insulating layer which is oppositely disposed from the interface of the semiconductor and the insulator has first areas that lie substantially within mutually parallel planes that are sloped with respect to the plane of the semiconductor-insulator interface. The surface of the insulating layer also has second areas that are disposed between the first areas. Electrodes that are responsive to clocking signals are located on the first areas of the insulator such that, when the clocking signals are applied, an electric field having a substantial lateral component is induced in the semiconductor to decrease the transfer time between adjacent potential wells of the charge-coupled device. A method for making a sloped oxide charge-coupled device includes the steps for growing an insulation layer on a semiconductor wafer; etching sloped areas into the surface of the insulation layer that is oppositely disposed from the interface between the semiconductor and the insulation layer; and depositing a conductor onto the sloped areas of the insulation layer to form the electrode structure of the device.

PREFERRED EMBODIMENT OF THE INVENTION

Figure 1:
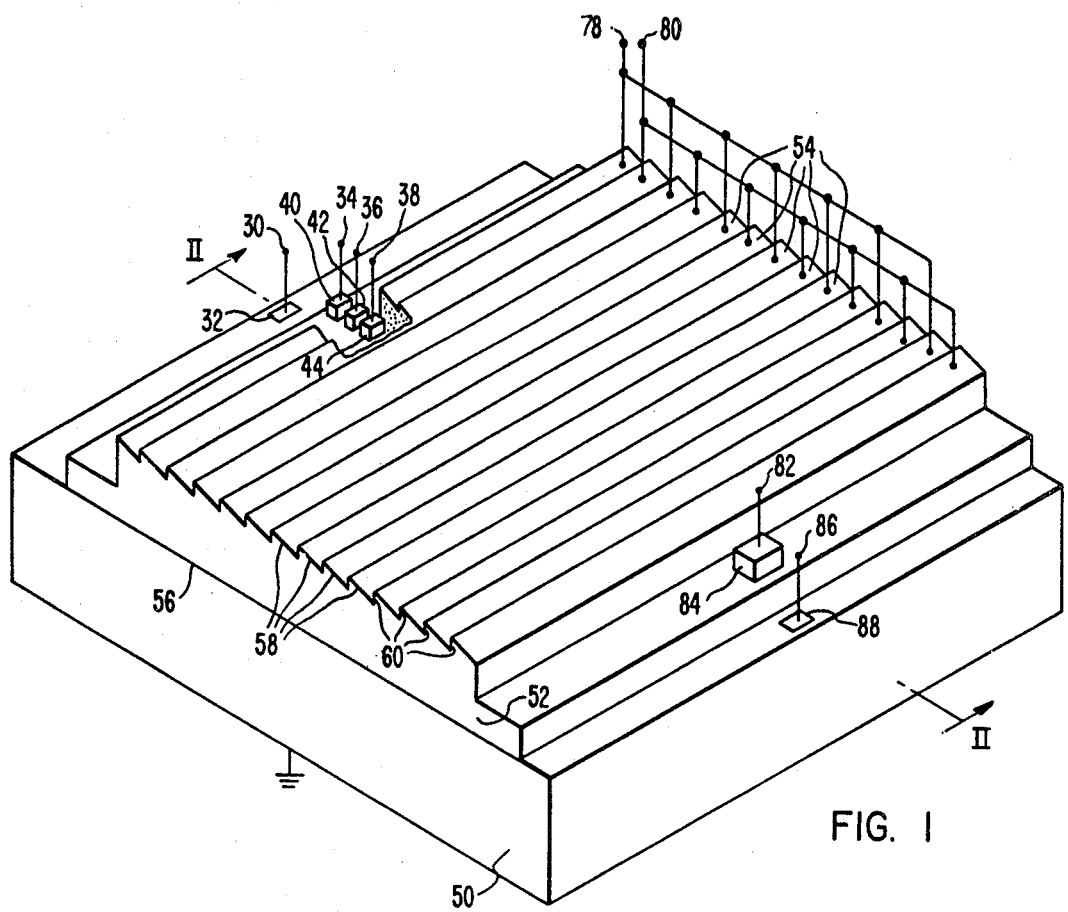
FIG. 1 illustrates an isometric view of the disclosed surface channel charge coupled device in which the electrodes are supported on sloped areas of the surface of the insulation layer.

FIG. 1 shows an isometric view of the sloped oxide charge-coupled device of the present invention. The charge-coupled device (CCD) is comprised of three basic parts or elements. These are: a charge injection structure, a charge clocking structure, or shift register, and a charge output structure.

In the disclosed CCD of FIG. 1, charge carriers are injected through a charge injection structure that includes: an input terminal 30; a diode 32; terminals 34, 36 and 38; signal gate 40; storage gate 42; and injection gate 44. In the operation of the charge injection structure, the charge carriers are injected through the input terminal 30 by forward biasing the diode 32. A measured amount of charge is injected into the CCD in accordance with signal, storage and injection signals applied to the terminals 34, 36 and 38 of the signal, storage and injection gates 40, 42 and 44, respectively.

The clocking structure or shift register includes: the semiconductor 50; the insulation layer 52; and an array of electrodes 54 and channel stops (not shown). As is shown in FIG. 1, the semiconductor 50 and the insulation layer 52 form a semiconductor-insulation interface 56. It is also further shown that the surface of the insulation layer 52 that is oppositely disposed from the semiconductor-insulation interface 56 is comprised of a plurality of first areas 58 which support the electrodes 54, said first areas being of significant size with respect to the size of the electrodes 54 in that the first areas 58 have a surface area on the order of the surface area of the electrodes 54. The first areas 58 also lie substantially within mutually parallel planes that are sloped with respect to the plane of said semiconductor-insulation interface 56. As used herein, the term "sloped surface" or "sloped area" is specifically defined to mean that the normal to the surface has some substantial component in the plane of the semiconductor-insulation interface 56. As will later become apparent, the slope of the first areas 58 is generally positive, where "positive slope" is defined to mean that the distance between the surface of the first area 58 and the semiconductor-insulation interface 56 monotonically decreases in the direction of signal charge flow for surface channel CCD's and increases for buried channel CCD's and peristaltic CCD's. Also, the surface of the insulation layer 52 includes a plurality of second areas 60 that are alternately disposed between said first areas 58. In the example of the preferred embodiment, the second areas 60 are shown as being substantially perpendicular to the semiconductor-insulation interface 56 such that the slope with respect to said interface is infinite. However, it will be apparent to those skilled in the art that the second areas 60 could have various other geometries and dispositions with respect to the interface 56. For example, the second areas 60 would comprise a planar surface having a slope which is of an opposite sense from the slope of the first areas 58. Alternatively, the second areas 60 could comprise one planar portion having a slope which is of an opposite sense from the slope of the first areas 58 and another planar portion which is substantially parallel to the interface 56. Also, the second areas 60 may comprise planar surfaces having a higher degree of slope with respect to the interface 56. Various other geometries may also be envisioned which, typically, will vary in dependence on the method by which the slope-insulator device is made. All such variations for the second areas 60 are considered to be equivalents of the second areas 60 as shown in the accompanying figures and as described herein. As will be further described in relation to FIGS. 2, 3 and 4, the slope of the electrodes 54 with respect to the semiconductor-insulation interface 56 gives rise to an induced electric field having a substantial lateral component when clocking signals are applied to the electrodes 54. As will also be further discussed, this substantial lateral component of the induced electric field provides a fourth mechanism for the transfer of charge carriers between adjacent potential wells to reduce the transfer time, thereby improving the response time of the charge-coupled device to the clocking signals.

The surface of the first areas 58 may have a continuous slope, or, alternatively, a continuous slope may be approximated by a first area having a number of discrete steps that form a differential approximation to a continuously sloping surface. That is, the first area 58 may be comprised of a number of discrete steps that deviate from a continuously sloping surface. For example, a staircase contains successive deviations having alternate senses of variation from a continuously sloping surface. Therefore, as used herein, the use of the term "sloped areas" is hereby specifically defined to include the staircase-type area as well as continuously sloping areas—any shape that approximates a sloped surface or any combination of the above.

For the specific example of the preferred embodiment, the semiconductor 50 is comprised of N-type silicon having a dopant concentration of $10^{15}$ atoms per cubic centimeter. Also, the insulation layer 52 is comprised of thermally grown silicon dioxide ($SiO_2$) and the electrodes 54 are comprised of aluminum (Al). However, as will be appreciated by those skilled in the art, other materials having equivalent characteristics could be substituted for the specific materials described. For example, the semiconductor could be comprised of p-type silicon and the insulation layer could be comprised of aluminum oxide ($Al_2O_3$) or $SiO_2$.

Typically, the slope of the first, or sloped, areas 58 with respect to the interface 56 of the semiconductor 50 and the silicon dioxide layer 52 is in the range of one to three degrees. However, an angle of 0.1° would be sufficient for the practice of the disclosed sloped insulator CCD. Angles greater than three degrees will further decrease the transfer time between adjacent wells of the CCD and generally improve operation performance of the CCD until saturation velocity is reached. However, the greater angle of slope of the area 58 with respect to the interface of the semiconductor 50 and the silicon dioxide layer 52 requires a higher voltage for the clocking signals applied to the electrodes 54. Therefore, the optimal degree of slope of the areas 58 with respect to the semiconductor-insulation interface 56 will be determined by the permissible tolerances in the application for which the CCD is intended. A measured amount of charge is transferred between adjacent potential wells formed by the electrodes 54 in response to clocking signals. In the example of FIG. 1 two clocking signals are applied to clocking terminals 78 and 80.

When the measured charge has been transferred through the CCD, it is provided as an output signal from the charge output structure which includes: the terminal 82; the output gate 84; the terminal 86; and the diode 88. The charge output structure provides an output signal in accordance with control signals provided to the terminal 82 of the output gate 84 and the terminal 86 of the diode 88.

Figure 2:
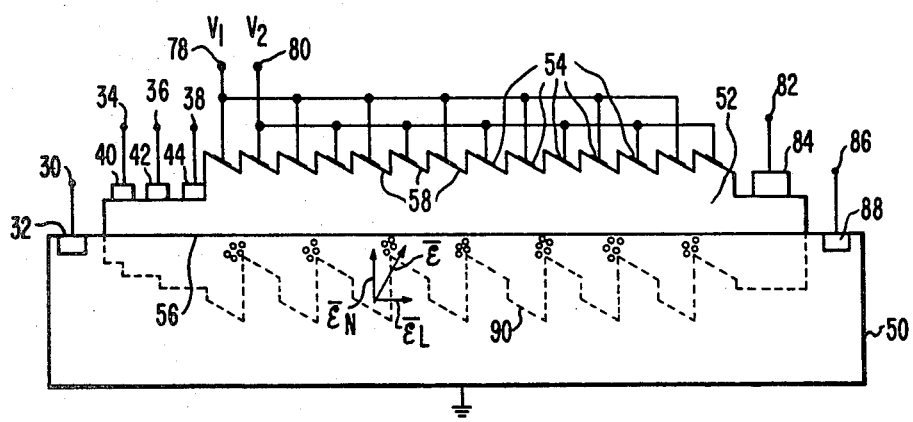
FIG. 2 shows a cross section of the charge-coupled device shown in FIG. 1 and illustrates the transfer of charge carriers through the charge-coupled device.

FIG. 2 shows a cross-section of the CCD of FIG. 1 and illustrates the operation of the preferred embodiment. As shown in FIG. 2, charge carriers are injected by applying a signal to the input terminal 30 to forward bias the injection diode 32. A measured quantity of charge carriers are transferred to the space charge regions formed in the semiconductor 50 in accordance with control signals applied to terminals 34, 36 and 38 of the signal, sotrage and injection gates 40, 42 and 44, respectively, as is well known and understood in the art. To describe this phase of the operation briefly, after the diode 32 is forward biased, the signals applied to the terminals 34 and 36 create a space charge region beneath the signal and storage gates 40 and 42, respectively. During this time, a zero or blocking signal is applied to terminal 38 of the injection gate 44. In response to these signals, charge carriers flow into the space charge region beneath the gates 40 and 42. The potential difference between the signals applied to the terminals 34 and 36 is such that a deeper space charge region is formed under the storage gate 42 than under the signal gate 40. When the diode 32 is again reverse biased, the charge carriers flow out of this space charge region to the ground plate. However, the deeper space charge region formed under the storage gate 42 traps a measured quantity of charge in a potential well, the depth of which is determined by the voltage difference between the signals applied to terminals 34 and 36. When this measured quantity of charge is to be injected into the space charge region formed by the electrodes 54, a signal is applied to the terminal 38 of the injection gate 44. The signal applied to the terminal 38 forms a deeper space charge region than that formed under the storage gate 42, but shallower than the potential well minima in the space charge region established by the electrodes 54, thereby causing the charge to flow into the potential minima of the space charge region of the electrodes 54.

Figure 3:
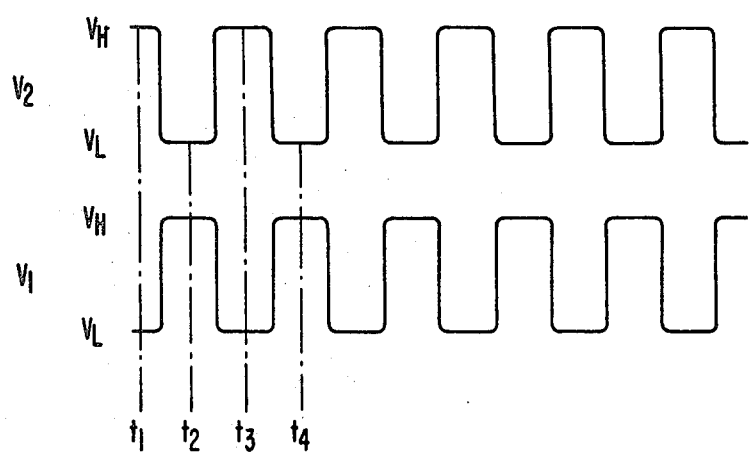
FIG. 3 illustrates typical clocking signals which are applied to the electrodes of the charge-coupled device.

As with CCD's of the prior art, the presently disclosed CCD operates to controllably advance the measured quantity of charge along a lateral path in response to clocking signals applied to the terminals 78 and 80. The terminals 78 and 80 control the voltages applied to adjacent members of the array of electrodes 54 so that, by simultaneously applying different potential magnitudes to the terminals 78 and 80, adjacent members of the electrode array 54 will provide different electric field intensities in accordance with the potentials applied thereto. This is illustrated by the dashed line 90 of FIG. 2 for a particular state of the clocking signals $V_1$ and $V_2$ where the magnitude of the potential applied to terminal 78 is greater than the magnitude of the potential applied to terminal 80. This state of the clocking signals $V_1$ and $V_2$ applied to the terminal 78 and 80, respectively, is illustrated in FIG. 3 at the time $t_1$. Under these conditions, the measured quantity of charge carriers will remain under the first element of the electrode array 54 because the electric field under this element is more intense than the electric field under the next adjacent element resulting in a deeper space-charge region in the portion of the semiconductor 50 located underneath the first element of the array. These deeper portions or potential minimas of the space-charge region located at portions of the semiconductor 50 underneath the electrode array 54 are sometimes referred to as CCD potential wells.

Figure 4:
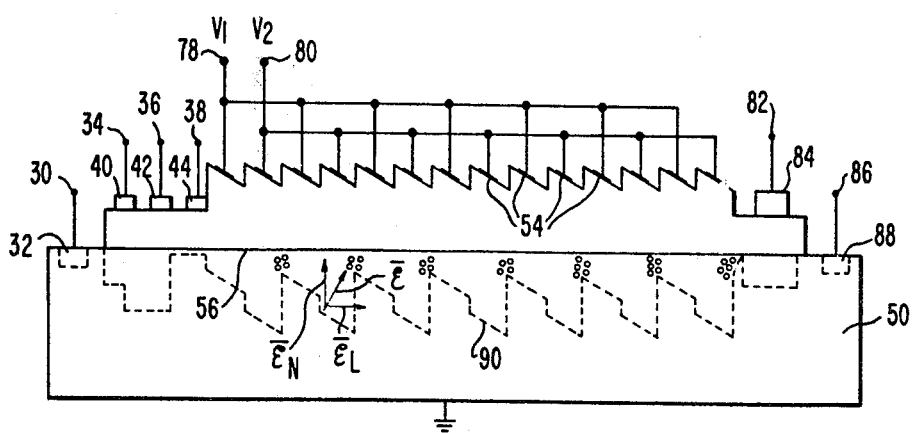
FIG. 4 shows a second cross section of the charge-coupled device illustrating the position of the potential wells in response to a second state of the clocking signals.

Referring again to FIG. 3, it is shown that, at time $t_2$, the relative states of the clocking signals $V_1$ and $V_2$ are transposed. Therefore, by analogy to the foregoing description of FIG. 2, it will be appreciated that the relative magnitudes of the electric fields provided by the adjacent elements of the electrode array 54 are also transposed. Consequently, as illustrated in FIG. 4, the CCD wells or deeper portions of the space-charge region are, at time $t_2$, located under the next adjacent electrode from that shown in FIG. 2. Furthermore, as the position of the CCD well was charged from the first element to the next adjacent element of the electrode array, the charge carriers formally located in the CCD well beneath the first element have, at time $t_2$, been transferred to the CCD well located beneath the second element as a result of the change in electric field intensity.

As is now apparent, the charge carriers located in a CCD well can be transferred from one element of the electrode array to the next by alternately varying the states of the clocking signals $V_1$ and $V_2$ supplied to the terminals 78 and 80. Therefore, at time $t_3$, for example, the space-charge region under the electrode array 54 again appears as shown in FIG. 2 but with the charge carriers that were injected under the first element of the array at time $t_1$ being located under the third element of the array at time $t_3$. Likewise, at the time $t_4$ of the waveforms $V_1$ and $V_2$ of FIG. 3, the potential wells under the electrode array 54 will appear as illustrated in FIG. 4 with the charge carriers injected at time $t_1$ now being located under the fourth element of the electrode array 54. By continuing the above described cycle, the charge carriers are transferred between adjacent CCD wells formed under the elements of the electrode array 54 and are thereby clocked through the disclosed CCD device to the output gate 84 where they are stored in response to an output signal provided to the terminal 82. The charge carriers then provide an output signal at terminal 86 when the diode 88 is reverse biased.

The disclosed CCD incorporates the three basic mechanisms for transfer of charge between adjacent CCD wells which were known in the prior art. Specifically, the self-induced drift field of the charge carriers of a common polarity causes the charge carriers to repel each other, thereby transferring at least some of the charge carriers into the adjacent CCD well. Also, the fringing drift field from the adjacent CCD well aids the transfer of the charge carriers from one well to the next. Lastly, a thermal diffusion process also operates to cause the charge carriers to migrate to the next adjacent CCD well.

In accordance with the present invention, it is shown in FIGS. 2 and 4 that the electric field $\vec{\varepsilon}$ intersects the plane of the interface 56 between the semiconductor 50 and the insulation layer 52 at an angle. This angular or sloped disposition of the electric field $\vec{\epsilon}$ with respect to the plate of the semiconductor-insulation interface 56 is the result of the elements of the electrode array 54 being mounted on the sloped areas 58 of the insulation layer 52. Therefore, the electric field $\vec{\epsilon}$ provided by each element of the electrode array 54 can be described in terms of a normal electric field component $\vec{\epsilon}_n$, which is normal to the plane of the interface 56, and a lateral field component $\vec{\epsilon}_L$ which is parallel to the plane of the interface 56. This lateral electric field component $\vec{\epsilon}_L$ provides a fourth transfer mechanism for transferring the charge between adjacent wells of the CCD in addition to the three transfer mechanisms known in the prior art. This fourth transfer mechanism affords substantially lower transfer times for the disclosed CCD than was previously available for prior art CCD's having electrodes that are parallel to the semiconductor.

FIGS. 2 and 4 also show that the lower boundary of the CCD wells is not in a plane substantially parallel to the semiconductor-insulation interface 56, but, rather, is in a plane that is sloped with respect to the plane of the interface 56 so that the charge distribution in the CCD well is largest in the region of the CCD well closest to the next adjacent electrode of the array 54 in the direction of charge transfer. This is illustrated in FIGS. 2 and 4 in which the charge carriers are shown to be located in the region of the CCD well which is closest to the space charge region formed by the next adjacent electrode of the CCD. This slope of the CCD well is reflective of the presence of the lateral component of the electric field $\vec{\epsilon}_L$. Since more of the charge is located in the region closest to the next adjacent space-charge region, on the average, the last fraction of charge transferred has a shorter distance over which it must be transferred in one cycle of operation, thereby further reducing the transfer time between adjacent CCD wells.

Figure 5:
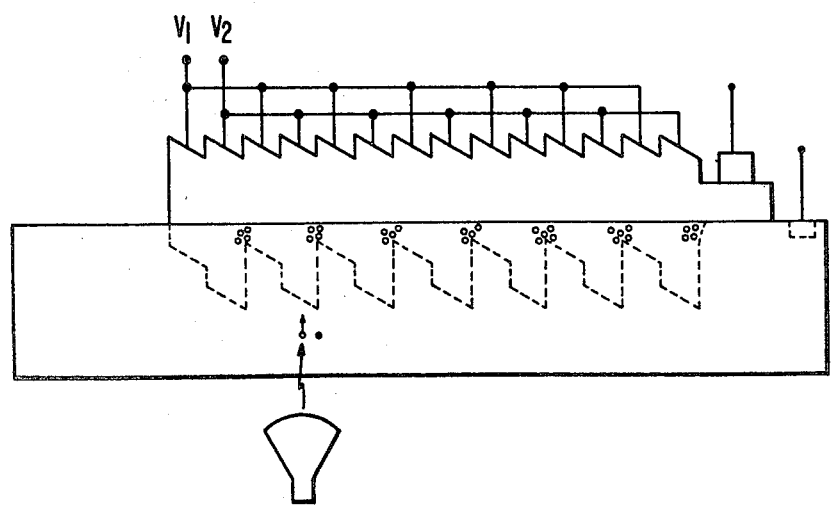
FIG. 5 shows a third cross section of the charge-coupled device illustrating the introduction of charge carriers in the semiconductor by photogeneration.

Although the particular example of the preferred embodiment has been described in relation to a CCD that is responsive to two clocking signals applied to the terminals 78 and 80, it will be apparent to those skilled in the pertinent art that an analogous technique could be applied to a CCD responsive to three or more clocking signals as well. Also, as shown in FIG. 5, the application of the present invention is not limited to CCD's in which the charge carriers are injected through diodes since other charge carrier injection methods are known in the art. For example, FIG. 5 illustrates the injection of charge carriers by a photogeneration technique.

Figure 6:
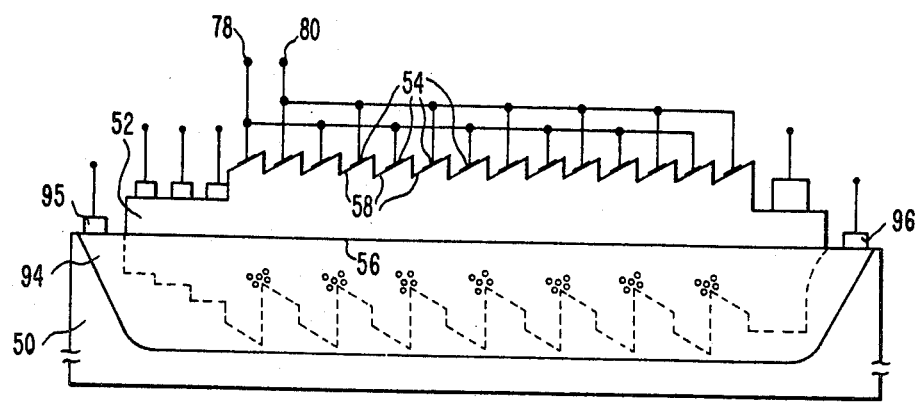
FIG. 6 shows a cross-section of the disclosed device as embodied in a buried channel charge-coupled device in which the electrodes are supported on sloped areas of the insulation layer.

It will be apparent to those skilled in the art that, in accordance with the description of the sloped insulator CCD of FIGS. 1-4, the present invention is also applicable to buried channel CCD's (BCCD). As shown in FIG. 6, a BCCD is provided with an insulation layer 52 having sloped areas 58 which support the electrodes 54. However, in addition to structure similar to that previously described with respect to FIGS. 1, 2 and 4, the BCCD of FIG. 6 also shows the inclusion of an ion implant 94 into the semiconductor wafer 50. As is also shown in FIG. 6, an injection gate in ohmic contact with the semiconductor 95 has replaced the injection diode 32 and an output gate in ohmic contact with the semiconductor 96 has replaced the output diode 88. In other respects, the BCCD of FIG. 6 is similar to the surface channel CCD of FIG. 1 and, as will be understood by those skilled in the art, operates to transfer measured amounts of charge from the injection structure along a charge transport channel formed at the interface of the semiconductor 50 and the ion implant 94 to the output structure in response to clocking signals applied to the terminals 78 and 80. It will be further noted that the electrode structure of the BCCD shown in FIG. 6 is similar to the electrode structure of the CCD described with respect to FIGS. 1-4 except that the electrode structure of FIG. 6 has an opposite sense of slope from that of FIGS. 1, 2, 4 and 5. Accordingly, the BCCD of FIG. 6 will have a faster transport time between adjacent potential wells due to the introduction of a fourth charge transfer mechanism as a consequence of a substantial lateral component ($\epsilon_L$) of the electric field ($\epsilon$). As was also described previously with respect to FIGS. 1-4, this substantial lateral component of the electric field is a consequence of the location of the electrodes 54 on sloped areas 58 of the insulation layer 52 such that the electrodes 54 are sloped with respect to the plane of the semiconductor-insulator interface 56.

Figure 7:
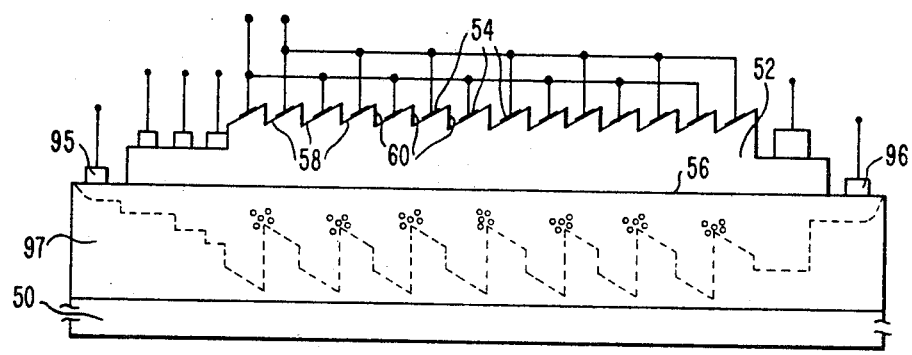
FIG. 7 shows a cross-section of the disclosed device as embodied in a peristaltic charge-coupled device in which the electrodes are supported on sloped areas of the insulation layer.

In a similar manner to the BCCD of FIG. 6, FIG. 7 shows a peristaltic charge coupled device (PCCD) which also incorporates the sloped oxide aspect of the surface channel CCD described with respect to FIGS. 1-4. The semiconductor 50 of FIG. 7 is further provided with an epitaxial layer 97 that, for the example of FIG. 7, is comprised of N-type silicon. Similarly to FIG. 6, the injection diode 32 and output diode 88 of FIGS. 1-4 have been replaced by the injection gate in ohmic contact with the semiconductor 95 and the output gate 96, respectively. In other respects, the structure of the PCCD of FIG. 7 is similar to the CCD of FIGS. 1-4 and, accordingly, respective parts have been given the equivalent reference characters. As will be understood by those skilled in the art, the operation of the PCCD of FIG. 7 is analogous to the PCCD's of the prior art in that a measured amount of charge is injected through the charge injection structure, transported along a charge transport channel by the clocking structure, and output by the output structure. However, the PCCD of FIG. 7 further incorporates the sloped oxide aspect of the CCD described in FIGS. 1-4. Specifically, the surface of the insulation layer 52 which is oppositely disposed from the semiconductor-insulator interface 56 includes first areas 58 which are sloped with respect to the semiconductor-insulator interface 56 and second areas 60 that are alternately disposed between the first areas, the second areas having a slope that is theoretically infinite with respect to the semiconductor-insulator interface 56. Therefore, in the operation of the device shown in FIG. 7, the charge transfer between adjacent potential wells of the PCCD will be subject to the fourth charge transfer mechanism previously described. That is, the charge transfer between adjacent CCD wells will be subject to a substantial lateral component ($\epsilon_L$) of the electric field ($\epsilon$). As previously described, this substantial lateral component ($\epsilon_L$) is a consequence of the fact that the electrodes 54 which control the progression of the potential wells along the charge transfer channel are located on the first, or sloped, areas 58 of the surface of the insulator 52.

FIGS. 8 through 17 illustrate a method for making the disclosed sloped oxide charge coupled device. The basic processing principle used is that different materials have differential etching rates in the same etching solution. Therefore, if a first material having a relatively high etching rate is deposited on an insulation layer having a relatively slow etch rate, and the surface of the first material is then protected by a second material from attack by the etching solution, the etching solution will attack the first material only from the exposed edges to laterally undercut the second material. As the first material is etched away, the etching solution attacks the exposed portion of the insulation layer resulting in a sloped surface for the insulation layer at the termination of the etching due to the lateral time gradient over which the insulation layer is exposed to the etching solution. Furthermore, if an etch stop is placed on one edge of the first material, the etching solution will attack the first material and the insulation layer in only one lateral direction such that the entire sloped area of the insulation layer has the same sense of slope.

Figure 8:
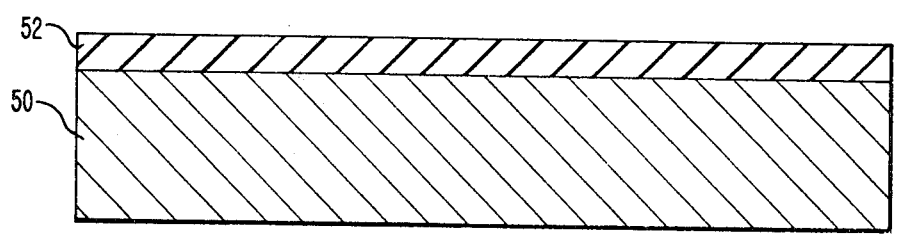
FIG. 8 shows the first step in a method for making the disclosed charge-coupled device in which an insulation layer of silicon dioxide is thermally grown on a semiconductor wafer.
Figure 9:
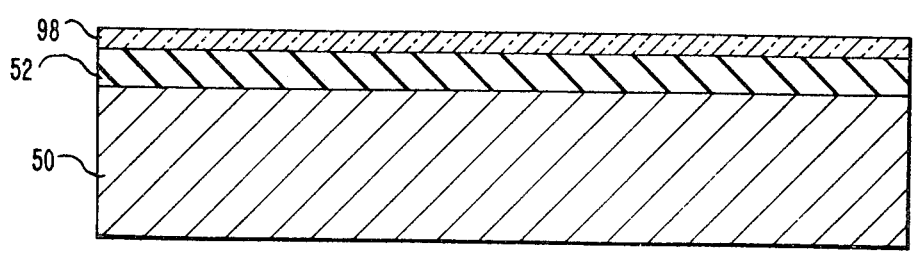
FIG. 9 illustrates the further step of depositing a first material of higher etch rate than the insulation layer on the surface of the insulator.

For the particular example of the preferred embodiment, FIG. 8 illustrates an insulation layer 52 comprised of silicon dioxide ($SiO_2$) which has been thermally grown on a semiconductor wafer 50 comprised of N-type silicon (Si) having a dopant impurity of approximately $10^{15}$ atoms per cubic centimeter. The silicon dioxide is grown by exposing the N-type silicon to an oxygen atmosphere at a temperature of approximately 1100° C. for a time of approximately one hour. FIG. 9 illustrates the addition of a layer of a first material having a substantially higher etching rate than silicon dioxide. Typically, the relative etching rates of the first material 98 and the silicon dioxide 52 are on the order of 100 to 1. However, as will become apparent later, other ratios may also be used depending on the desired slope of the sloped area of the silicon dioxide. Typical examples of such a first material are phosphorus-doped oxide or phosphorus silicate glass which have an etching rate of approximately 5000 to 7000 Angstroms per minute in a ten to one ($H_2O$) to hydrogen fluoride (HF) mixture. Another suitable example of the first material is polysilicon which has an etching rate of approximately 15000 Angstroms per minute in a mixture of acetic acid, nitric acid, and hydrogen fluoride (HF). For the example of FIG. 9, a layer of phosphorus glass 98 is selected as the first material. Typically, the layer of silicon dioxide 52 will have a thickness of approximately 1000 to 3000 Angstroms and the layer of phosphorus glass will have a thickness of approximately 3000 Angstroms to 10,000 Angstroms.

Figure 10:
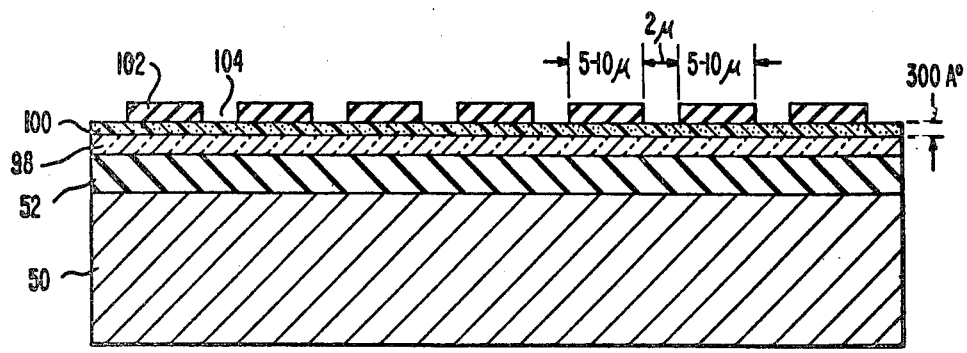
FIG. 10 illustrates the depositing of a second material of lower etch rate than the insulation layer and the definition of windows in a layer of photoresist as the next step of the process.

FIG. 10 shows that, as the second material, a layer of silicon nitride ($Si_3N_4$) 100 is added to the structure shown in FIG. 9. The silicon nitride layer has a thickness of approximately 300 Angstroms and is added by gaseous deposition. Also shown in FIG. 10, a layer of photoresist 102 is spun over the surface of the silicon nitride layer 100 and windows 104 are defined in the photoresist layer 102 to expose selected portions of the silicon nitride layer 100. Typically, the distances between adjacent windows of the photoresist layer 102 will be on the order of five to ten microns with the window in the photoresist layer 102 being approximately 2 microns wide.

As is well known in the art, the windows 104 may be defined in the photoresist 102 by covering the photoresist layer with an appropriate photographic mask (not shown) and exposing the photoresist layer to light. If a positive photoresist is used, the portions of the photoresist layer 102 exposed to the light will undergo a photochemical reaction as a result of which they can be selectively removed by a solvent. Conversely, if a negative photoresist material is used, the portions of the photoresist layer 102 which are exposed to the light with polymerize and the unexposed areas can be selectively removed with a solvent. Such photoresist materials are commercially available and are in common use by those skilled in the pertinent art. The structure shown in FIG. 10 is then dipped in a first etching solution containing phosphoric acid which will attack the exposed portions of the silicon nitride layer 100 and etch away the exposed portions of the silicon nitride layer to the interface between the phosphorous glass layer 98 and the silicon nitride layer 100. The remaining portions of the photoresist layer 102 are then washed away with a commercially available developer and the structure placed in a second etching solution which, for the example of the preferred embodiment, is comprised of a mixture of ten parts of water ($H_2O$) to one part of hydrogen fluoride (HF). This second etching solution will attack the exposed portions of the phosphorous glass layer 98 and will etch away these portions until the interface between the silicon dioxide layer 52 and the phosphorous glass layer 98 is reached thereby etching a channel in the structure corresponding to each window 104 in the photoresist layer 102. Each channel thus formed has a base formed by the surface of the silicon dioxide layer 52 and sides formed by the exposed edges of the phosphorous glass layer 98 and the silicon nitride layer 100. Accordingly, the remaining portions of the phosphorous glass layer 98 and the silicon nitride layer 100 between successive channels comprise a dual layer structure that is supported on the insulation layer. The second etching solution will also attack the silicon dioxide layer 52 so care must be taken that the structure is removed from the etching solution at the time when the exposed portions of the phosphorous glass have been etched away. However, the high contrast between the etching rates of the phosphorous glass 98 and the silicon dioxide layer 52 makes the time at which the structure must be removed from the second etching solution less critical.

Figure 11:
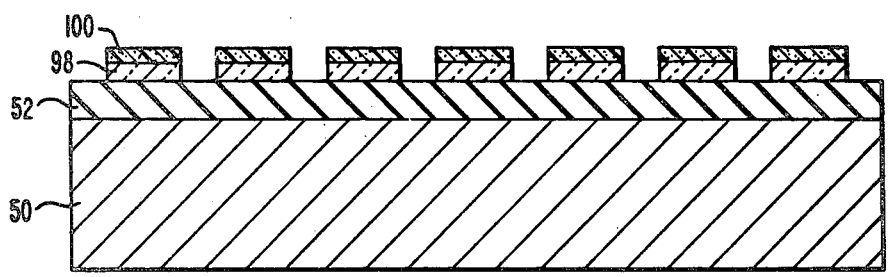
FIG. 11 shows the configuration of a dual layer structure after a series of channels have been etched through the layers of the first and second materials and the photoresist has been removed.
Figure 12:
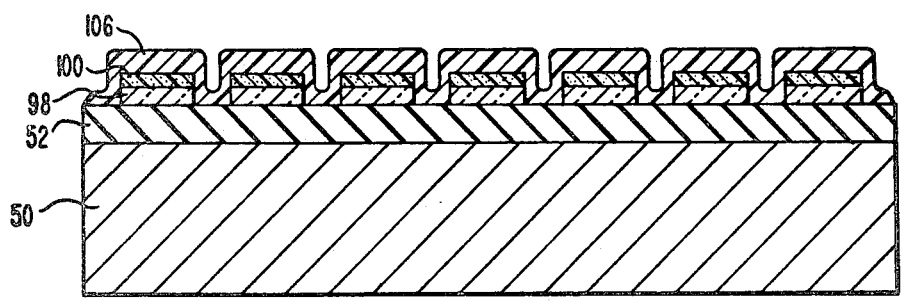
FIG. 12 shows the deposition of a third material on the dual layer structure and the exposed portions of the insulator, the third material having a higher etch rate than the insulation layer, but lower than the first material.
Figure 13:
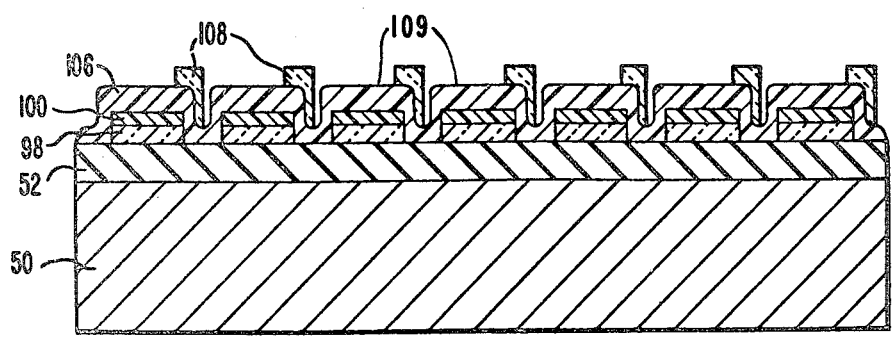
FIG. 13 shows the definition of windows in a second photoresist layer to determine the position of etch stops on one edge of the channel in the first and second materials.
Figure 14:
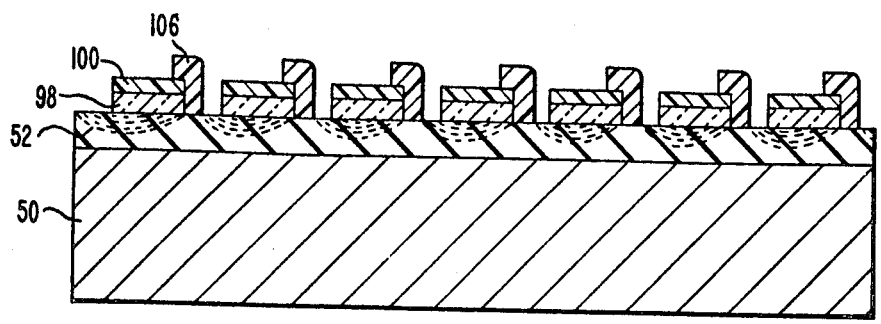
FIG. 14 shows the structure that remains after etching the structure shown in FIG. 13 and removing the photoresist layer.

After the phosphorous glass 98 has been properly etched in the second etching solution, the structure thus far developed will appear substantially as shown in FIG. 11. To the structure shown in FIG. 11, a layer of polysilicon 106 is added by gaseous deposition as shown in FIG. 12. The polysilicon layer 106 covers the exposed portions of the silicon nitride layer 100, the phosphorous glass layer 98 and the silicon dioxide layer 52. As shown in FIG. 13, a second phosphorous glass layer 108 is applied to the surface of the polysilicon layer 106. A second photoresist layer is spun over the surface of the phosphorous glass layer 108 and windows are defined in the second photoresist layer in a manner similar to that described with respect to the definition of the windows 104 in the photoresist layer 102. The second etching solution is then applied to the portions of the second phosphorous glass layer 108 that are exposed through the windows defined in the second photoresist layer to etch windows 109 into the second phosphorous glass layer 108. The remaining portions of the second photoresist layer are then removed by a developer such that, as shown in FIG. 13, the remaining portions of the phosphorous glass layer 108 cover the portions of the polysilicon layer 106 which cover one side of each channel which was etched into the silicon nitride layer 100 and the phosphorous glass layer 98. The remaining portions of the phosphorous glass layer 108 also cover portions of the polysilicon layer 106 that cover a portion of the silicon dioxide layer 52 which were exposed by etching the channels in the phosphorous glass layer 98 and the silicon nitride layer 100. The structure shown in FIG. 13 is then placed in a third etching solution which will attack the exposed portions of the polysilicon layer 106. This third etching solution contains nitric acid (HNO$_3$) and hydrogen fluoride (HF). This third etching solution has limited effect on the silicon nitride, phosphorous glass, and silicon dioxide layers 100, 98 and 52 respectively. Other etchants such as hydrazine and plasma etching can also be used to remove the exposed polysilicon layer. After the exposed portions of the polysilicon layer 106 have been etched away by the third etching solution, the remaining portions of the second phosphorous glass layer 108 are removed by the second etching solution so that the remaining structure appears as shown in FIG. 14. As shown in FIG. 14, the portions of the polysilicon layer 106 which were protected from attack in the third etching solution by the remaining portions of the phosphorous glass layer 108 cover at least one side of the channels etched in the silicon nitride layer 100 and the phosphorous glass layer 98. Furthermore, the polysilicon layer 106 is substantially immune from attack by the second etching solution which will attack the exposed portions of the phosphorous glass layer 98 and the silicon dioxide layer 52. Accordingly, the remaining portions of the polysilicon layer 106 comprise etch stops which will prevent the attack of the remaining portions of the phosphorous glass layer 98 from one side of the channel when the structure of FIG. 14 is dipped in the second etching solution.

When the structure of FIG. 14 is exposed to the second etching solution, the remaining portions of the phosphorous glass layer 98 and the exposed portions of the silicon dioxide layer 52 are attacked by the etching solution. However, due to the drastically different etching rates between the phosphorous glass layer 98 and the silicon dioxide layer 52, the second etching solution will etch the remaining portions of the phosphorous glass layer 98 laterally at a much higher rate than it will etch the exposed portions of the silicon dioxide layer 52. As portions of the phosphorous glass layer 98 are etched away, further surfaces of the silicon dioxide layer 52 located at the interface of the silicon dioxide layer 52 and the phosphorous glass layer 98 are exposed. These further exposed areas are then etched at the rate of etching for the silicon dioxide layer 52. This etching process, therefore, relies on the differential etching rates of the silicon dioxide layer 52 and the phosphorous glass layer 98 as is illustrated in FIG. 14 by the dashed lines within the silicon dioxide layer 52 and the phosphorous glass layer 98. The etching process is continued until the remaining portions of the phosphorous glass layer 98 have been completely etched away. The resulting structure is then dipped in the third etching solution so that the remaining portions of the polysilicon layer 106 comprising the etch stops are completely removed from the surface of the silicon dioxide layer 52.

Figure 15:
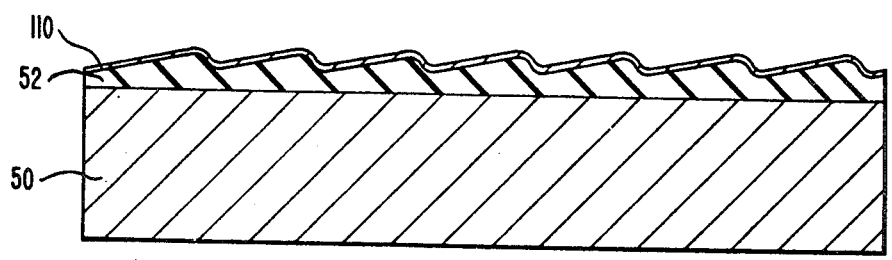
FIG. 15 illustrates the evaporation of a conducting material onto the surface of the insulator shown in FIG. 14 after the first material is completely etched away and the second and third materials have been removed.

The end result of the etching process performed on the structure of FIG. 14 is shown by the structure of FIG. 15. FIG. 15 shows that the first areas of the sloped areas 58 have been etched into the surface of the silicon dioxide layer 52 and, that these sloped areas 58 are separated by the second areas 60 which were previously described in relation to FIG. 1. Aluminum, or another suitable conductor, is then evaporated over the entire surface of the silicon dioxide layer 52 as illustrated in FIG. 15 to provide an aluminum layer 110 over the entire surface of the silicon dioxide layer 52.

Figure 16:
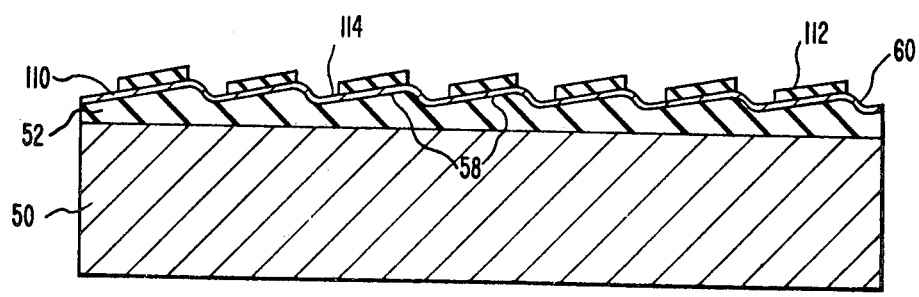
FIG. 16 shows the definition of windows in a layer of photoresist added to the structure shown in FIG. 15.
Figure 17:
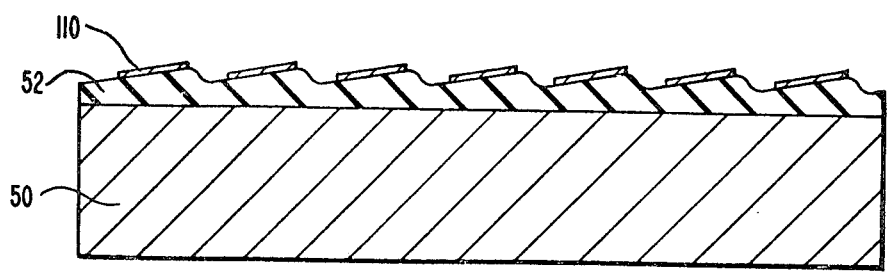
FIG. 17 shows the charge-coupled device after etching the structure of FIG. 16 and removing the photoresist layer.

As shown in FIG. 16, a third layer of photoresist 112 is spun over the surface of the aluminum layer 110 and windows 114 are defined in the photoresist layer 112 covering the areas 60 of the silicon dioxide layer 52. The exposed portions of the aluminum layer 110 are then etched to the interface of the silicon dioxide layer 52 and the aluminum layer 110. Afterwards, the remaining portions of the photoresist layer 112 are washed away with a developer to provide the surface channel sloped insulator CCD described in FIGS. 1, 2 and 4 as shown in FIG. 17. The gaps between adjacent members of the electrodes 54 are made small to limit the formation of the potential barriers to charge transfer between adjacent CCD wells. Since the height of such potential barriers is directly related to the physical proximity of the electrodes 54, the gap between the electrodes is typically on the order of 2000 Å.

Figure 18:
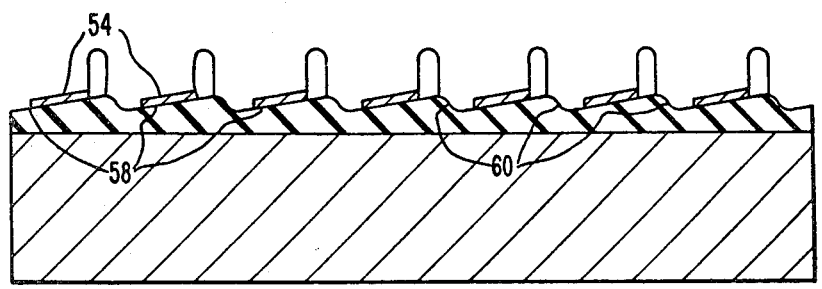
FIG. 18 shows an alternative method in which parts of the etch stop structure of FIG. 14 have not been removed, and also illustrates the addition of electrodes through an evaporation process.

As a modification of the above-described method for making the sloped insulator CCD, prior to the evaporation process previously described with respect to FIG. 15, FIG. 18 shows that the etch stops formed by the remaining portions of the polysilicon layer 106 have remained after the etching process performed on the structure of FIG. 14 in accordance with the method described in relation to FIGS. 8 through 14. As is further illustrated in FIG. 18, these remaining etch stops can be used to deposit the electrodes 54 onto the sloped areas 58 by a shadow evaporation process. The electrodes may be comprised of aluminum (Al) which is shadow evaporated onto the sloped areas 58, although it will be appreciated that other conductors would also be suitable for this purpose.

It will be apparent to those skilled in the art that the staircase approximation to the continuously sloped surface of first area 58 which was previously described can be produced in accordance with ion beam etching techniques which are well known in the art.

Figure 19:
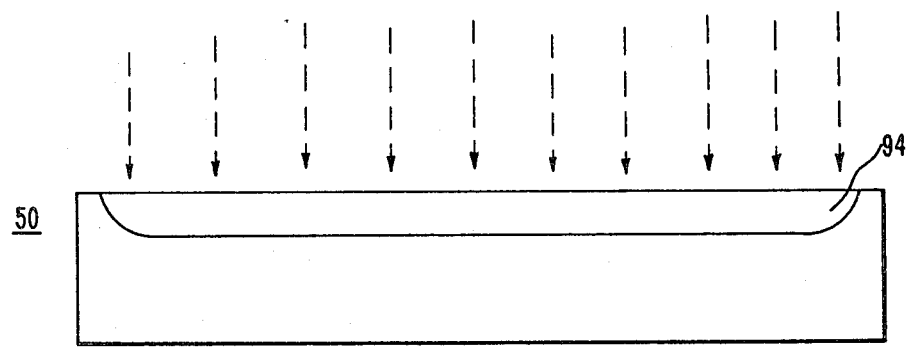
FIG. 19 shows a step of forming an ion implant in a semiconductor wafer for use in a method of making a buried channel charge coupled device.

To achieve the manufacture of the BCCD of FIG. 6, either the method described in relation to FIGS. 8 through 17 or the method described in relation to FIGS. 8 through 14 and FIG. 18 may be employed with one antecedent modification. Specifically, the modification of each of the previously described methods is that, prior to the addition of the insulation layer 52 to the semiconductor 50 as described in relation to FIG. 8, the semiconductor wafer 50 is modified by implanting the ion implant 94 into the semiconductor substrate. This implantation may be accomplished by bombarding the surface of the semiconductor substrate with atoms of a suitable implantation material which will invert the polarity of the implanted region relative to the original polarity of the substrate (see FIG. 19). For the example of FIG. 6, atoms of phosphorus (P), boron (B) or arsenic (As) may be used. Then, by following the methods previously described in relation to FIGS. 8 through 18, the manufacture of the BCCD shown in FIG. 6 will be accomplished.

Figure 20:
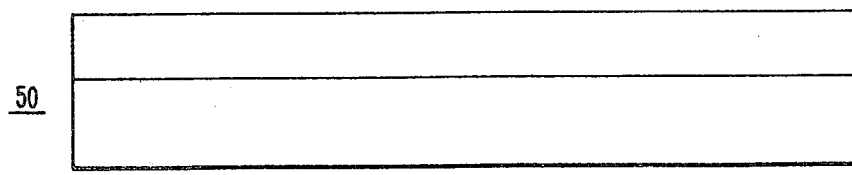
FIG. 20 shows a step of forming an epilayer on a semiconductor wafer for use in a method of making peristaltic charge coupled devices.

Similarly, the construction of the PCCD shown in FIG. 7 may also be accomplished by employing either of the methods previously described in relation to FIGS. 8 through 18 with the addition of one antecedent step. For the case of the PCCD of FIG. 7, this additional step is that, prior to the addition of the insulation layer 52 described with respect to FIG. 8 the semiconductor 50 is modified by adding an epitaxial layer to the semiconductor substrate. For the example of FIG. 7, the epitaxial layer 97 is comprised of N-type semiconductor that is grown over the p-type semiconductor substrate by introducing an N-type impurity during the growth of the semiconductor epitaxial layer 50 (see FIG. 20). For the example of FIG. 7, this impurity can be phosphorus, although arsenic or other materials of suitably similar characteristics may also be used. Thereafter, the procedure of either method described in relation to FIGS. 8 through 18 can be employed to provide the PCCD shown in FIG. 7.

In accordance with the foregoing description, the disclosed sloped insulator charge coupled device provides faster transfer times between adjacent wells of the CCD due to the introduction of a substantial electric field lateral component ($\vec{\epsilon}_L$) in the electric field ($\vec{\epsilon}$) provided by the elements of the electrode array 54. This electric field lateral component ($\vec{\epsilon}_L$) is a consequence of the disposition of the sloped areas 58 of the insulation layer 52. The substantial electric field lateral component ($\epsilon_L$) operates as a fourth charge carrier transfer mechanism in addition to the transfer mechanisms employed by prior art CCD's to improve the response of the disclosed device. As described in FIGS. 8 through 20, novel methods for making a charge coupled device having this sloped insulator structure have also been described.

We claim:

1. A method for making a charge-coupled device that has electrodes deposited on sloped areas of an insulation layer, said method comprising:

growing an insulation layer on a semiconductor wafer such that the insulation layer and the semiconductor form an insulation-semiconductor interface;

depositing a first etching material on the surface of the insulation layer that is oppositely disposed from the insulation-semiconductor interface, said first etching material being reactive with etching solutions with which said insulation layer is also reactive, said first etching material having a substantially higher etching rate in said etching solutions than said insulation layer;

depositing a second etching material on said first etching material, said second etching material being substantially inert with etching solutions with which said insulation layer and said first etching material are reactive;

forming a bilayer structure on said insulation layer, said bilayer structure including portions of said first and second layers of etching material with channels provided in selected portions of said first and second layers;

depositing a third layer of etching material over said bilayer structure and over said insulation layer within the channels of said bilayer structure, said third layer of etching material being reactive with etching solutions with which said first etching material and said insulation layer are reactive, said third etching material having a substantially higher etching rate in said etching solutions than said insulation layer;

forming a channel in the third etching material, said channel being offset with respect to the channel in said bilayer structure such that a portion of said channel in the third etching material coincides with a portion of the channel of said bilayer structure;

etching said first and third etching materials and said insulation layer until said first and third etching materials are etched away and areas of said insulation layer that were covered by said first etching material are etched to form sloped areas which are substantially in a plane that intersects the plane of the insulation-semiconductor interface; and depositing electrodes on the sloped areas of the insulation layer surface so that the electrodes induce an electric field in said semiconductor wafer in response to clocking signals, said electric field having a substantial lateral component that aids the transfer of charge carriers through the semiconductor wafer.

2. The method of claim 1 further comprising the step of:

implanting an ion implant in a semiconductor substrate to form said semiconductor wafer, said step of implanting occurring prior to said step of growing an insulation layer on the semiconductor wafer.

3. The method of claim 1 further comprising the step of:

depositing an epitaxial layer on the surface of a semiconductor substrate to form said semiconductor wafer, said step of depositing occurring prior to said step of growing an insulation layer on the semiconductor wafer.

4. The method of claim 1 wherein said step of forming a bilayer structure on said insulation layer includes the steps of:

spinning a layer of photoresist over said second etching material;

defining windows in selected portions of said photoresist layer that cover the channel portions selected for said bilayer structure;

etching a first channel in the second etching material, said first channel coinciding with the window of said photoresist layer;

etching a second channel in the first etching material, said second channel coinciding with the first channel of said second etching material and with the window of said photoresist layer; and removing the remaining portions of the photoresist layer to form the bilayer structure on said insulation layer, said bilayer structure including the remaining portions of said first and second etching materials, and having channels coinciding with the windows of said photoresist layer.

5. The method of claim 1 wherein said step of forming a channel in said third etching material includes the steps of:

depositing a layer of oxide over said third etching material;

spinning a layer of photoresist over said deposited oxide layer;

defining a window in said layer of photoresist, the position of said window being offset with respect to the channels in said bilayer structure such that a portion of said window coincides with a portion of the channel of said bilayer structure;

etching a channel in the deposited oxide layer, said channel coinciding with the window of said second layer of photoresist; and etching a channel in the third etching material, said channel coinciding with the channel in the deposited oxide layer.

6. The method of claim 1 wherein said step of depositing electrodes on the sloped areas of the insulation layer surface includes the steps of:

evaporating a conductor onto the surface of the insulation layer;

spinning a layer of photoresist over the surface of the evaporated metal;

defining the photoresist to form windows over second areas of the insulation layer that are alternately disposed between said sloped areas, where the degree of slope of said second areas with respect to said interface is substantially greater than the degree of slope of said sloped areas; and etching the conductor exposed through the windows of the photoresist layer, said exposed conductor being etched to the insulation layer to provide conducting electrodes on the sloped areas of the insulation layer.

7. A method of making a charge coupled device having an insulation with first and second oppositely disposed surfaces, said second surface including first areas that are sloped with respect to said first surface, and also including second areas that are alternately disposed between said first areas, where the degree of slope of said second areas with respect to said first surface is substantially greater than the degree of slope of said first areas; a semiconductor wafer, said first surface being disposed on said semiconductor wafer; and electrodes disposed on said first areas of said second surface; said method comprising:

growing an insulation layer on the semiconductor wafer;

depositing a first high etching rate material on the insulation layer;

depositing a layer of silicon nitride on the first high etching rate material;

forming a channel in selected portions of said first high etching rate material and said silicon nitride layer;

depositing a second layer of high etching rate material over the surface of the silicon nitride and over the portions of the insulation, first high etching rate material, and silicon nitride layers exposed within the channel formed in the selected portions of the first high etching rate material and the silicon nitride layer;

forming a channel in the second layer of high etching rate material, said channel being offset from the channel formed in the first layer of high etching rate material and the silicon nitride layer such that a portion of the channel in the second layer of high etching rate material coincides with a portion of the channel formed in the first layer of high etching rate material and the silicon nitride layer;

etching the first and second layers of high etching rate material and the insulation layer to provide said first areas in the second surface of said insulation layer; and shadow evaporating a conductor onto said first areas of said insulation layer to provide a charge-coupled device having electrodes mounted on the first areas which are sloped with respect to the first surface of said insulation layer.

8. The method of claim 7 wherein said step of forming a channel in said first high etching rate material and said silicon nitride layer includes the steps of:

spinning a layer of photoresist on the surface of the silicon nitride layer;

defining a window in selected portions of the photoresist to expose the surface of said silicon nitride coincident with the window in said photoresist;

etching the exposed surface of the silicon nitride in a first etching solution to expose the surface of said high etching rate material coincident with the window in said photoresist;

etching the exposed surface of the high etching rate material coincident with the window in said photoresist; and removing the remaining portions of the photoresist layer from the surface of the silicon nitride layer.

9. The method of claim 7 wherein said step of forming a channel in the second layer of high etching rate material includes the steps of:

depositing a layer of oxide over said second layer of high etching rate material;

spinning a layer of photoresist over the deposited layer of oxide;

defining a window in the layer of photoresist, said window being offset from the channel formed in the first layer of high etching rate material and the silicon nitride layer such that a portion of the window in the layer of photoresist coincides with a portion of the channel formed in the first layer of high etching rate material and the silicon nitride layer;

etching a channel in the deposited oxide layer to the second layer of high etching rate material where the deposited oxide layer coincides with the window defined in the layer of photoresist; and etching a channel in the second layer of high etching rate material to the insulation layer where the second layer of high etching rate material coincides with the channel in the deposited oxide layer and with the channel formed in the first layer of high etching rate material and the silicon nitride layer, and etching other portions of the second layer of high etching rate material coinciding with the channel in the deposited oxide layer to the silicon nitride layer.

* * * * *